(12) United States Patent
Ishii

(10) Patent No.: US 6,831,336 B2
(45) Date of Patent: Dec. 14, 2004

(54) SEMICONDUCTOR INTEGRATED CIRCUIT

(75) Inventor: Toshiki Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/287,072

(22) Filed: Nov. 4, 2002

(65) Prior Publication Data
US 2003/0089955 A1 May 15, 2003

(30) Foreign Application Priority Data

Nov. 9, 2001 (JP) .......................................... 2001-345241
Oct. 10, 2002 (JP) .......................................... 2002-297691

(51) Int. Cl.[7] .............................................. H01L 29/72
(52) U.S. Cl. ...................... 257/401; 257/403; 257/405; 257/407

(58) Field of Search ............................... 257/401, 403, 257/405, 407, 401 T

(56) References Cited

U.S. PATENT DOCUMENTS 5,874,764 A * 2/1999 Hsieh et al. ................. 257/401

* cited by examiner

Primary Examiner—Edward Wojciechowicz
(74) Attorney, Agent, or Firm—Adams & Wilks

(57) ABSTRACT

A semiconductor device capable of accurately controlling the current value is provided. In a semiconductor integrated circuit having a constant current circuit, the constant current circuit includes a plurality of constant current elements having a gate terminal and a source terminal in common. Branched drain terminals of the constant current element arranged on one end of the gate terminal and the source terminal are arranged to both the gate terminal and the source terminal.

9 Claims, 7 Drawing Sheets

SEMICONDUCTOR INTEGRATED CIRCUIT

BACKGROUND OF THE INVENTION

1. Field of the Invention

The present invention relates to a circuit structure that uniformly controls a current value of different channels in a constant current circuit using a plurality of constant current elements each of which outputs a desired current ratio.

2. Description of the Related Art

FIG. 3 is a structural diagram showing the arrangement of N constant current elements in a conventional constant current circuit that outputs the same current. In a conventional constant current circuit using a plurality of p-type or n-type MOS transistors as constant current elements each of which outputs a desired current ratio, as shown in FIG. 3, the constant current element of each channel serves as an individual and complete constant current circuit. A gate terminal 1 and a source terminal 2 are commonly used in the respective constant current elements. Also, in order from one end of the gate terminal 1 and source terminal 2, a first drain terminal 6 that corresponds to first output terminal channel 3, a second drain terminal 7 that corresponds to a second output terminal channel 4 and an N-th drain terminal 8 that corresponds to an N-th output terminal channel 5 are branched. Reference numeral 12 denotes a contact hole for wiring.

FIG. 4 is a diagram showing the schematic structure of N conventional constant current circuits that output the same current. In FIG. 4, in order to understand the arrangement diagram more easily, the gate terminal 1 and the source terminal 2 are omitted from the structural diagram of FIG. 3, and only the connection of the drain terminals is shown. In this way, the constant current elements respectively having the second output terminal channel 4 and the second output terminal channel 5 are disposed adjacent to the completed layout of the constant current element having the first output terminal channel 3 and the first drain terminal 6, and the same arrangement is used for each element up to the N-th constant current element. Also, in a conventional structural example, constant current elements in which the drain terminal is not branched are arranged in parallel with each other (refer to Patent Document 1 is JP 9-73331 A (FIG. 6)).

However, in the conventional structure described above, a difference in the wiring resistance value occurs in portions that correspond to gate terminal 1 and the source terminal 2 because there is a difference in the distance form the constant current source due to the arrangement of the respective constant current elements. As a result, there arises a problem in that the current and the voltage which are supplied from the gate terminal 1 and the source terminal 2 are different among the respective current constant elements. In addition, because an influence of temperature due to other structural elements or the like is different depending on locations at which the respective constant current elements are arranged, a difference occurs in the current values of the respective channels due to an influence of the wiring resistance value and the temperature, resulting in a problem in that accurate control of current becomes difficult.

SUMMARY OF THE INVENTION

The present invention has been made in order to solve the above-mentioned problems.

To achieve the above object, according to the present invention, respective drain branched terminals of p-type or n-type MOS transistors which are constant current elements of a constant current circuit are disposed alternately for a plurality of pieces from both ends of a layout pattern. That is, in the case where N constant current elements exist in the constant current circuit, the drain terminals are disposed from one end thereof in the order of a first-channel drain terminal, a second-channel drain terminal and so on up to an N-th channel drain terminal, and the drain terminals are also disposed from a left end in the order of a first-channel drain terminal, a second-channel drain terminal and so on up to an N-th channel drain terminal in such a manner that the N-th channel branched drain terminals are adjacent to each other in the center.

Also, as another means, the respective branched drain terminals of the p-type or n-type MOS transistors which are the constant current elements of the constant current circuit are disposed alternately for a plurality of pieces from one end of the layout pattern. That is, in the case where N constant current elements are disposed in the constant current circuit, the drain terminals are disposed from one end thereof in the order of a first-channel drain terminal, a second-channel drain terminal and so on up to an N-th channel drain terminal, and the drain terminals are again disposed in the order of a first-channel drain terminal, a second-channel drain terminal and so on up to an N-th channel drain terminal, so that in the case where the number of respectively branched drain terminals is M, the drain terminals are disposed alternately by M drain terminals.

With the above arrangement, it is possible to unify an influence of wiring resistances which are added to the source terminal and the gate terminal by the element unit of the p-type or n-type MOS transistor which is each constant current element. In addition, it is possible to unify an influence of current values due to a change in temperature. Therefore, in the constant current circuit that outputs a plurality of desired current ratios, it is possible to improve a precision of the current value control of the respective channels.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Hereinafter, a description will be given of preferred embodiments of the present invention with reference to the accompanying drawings.

Figure 1:
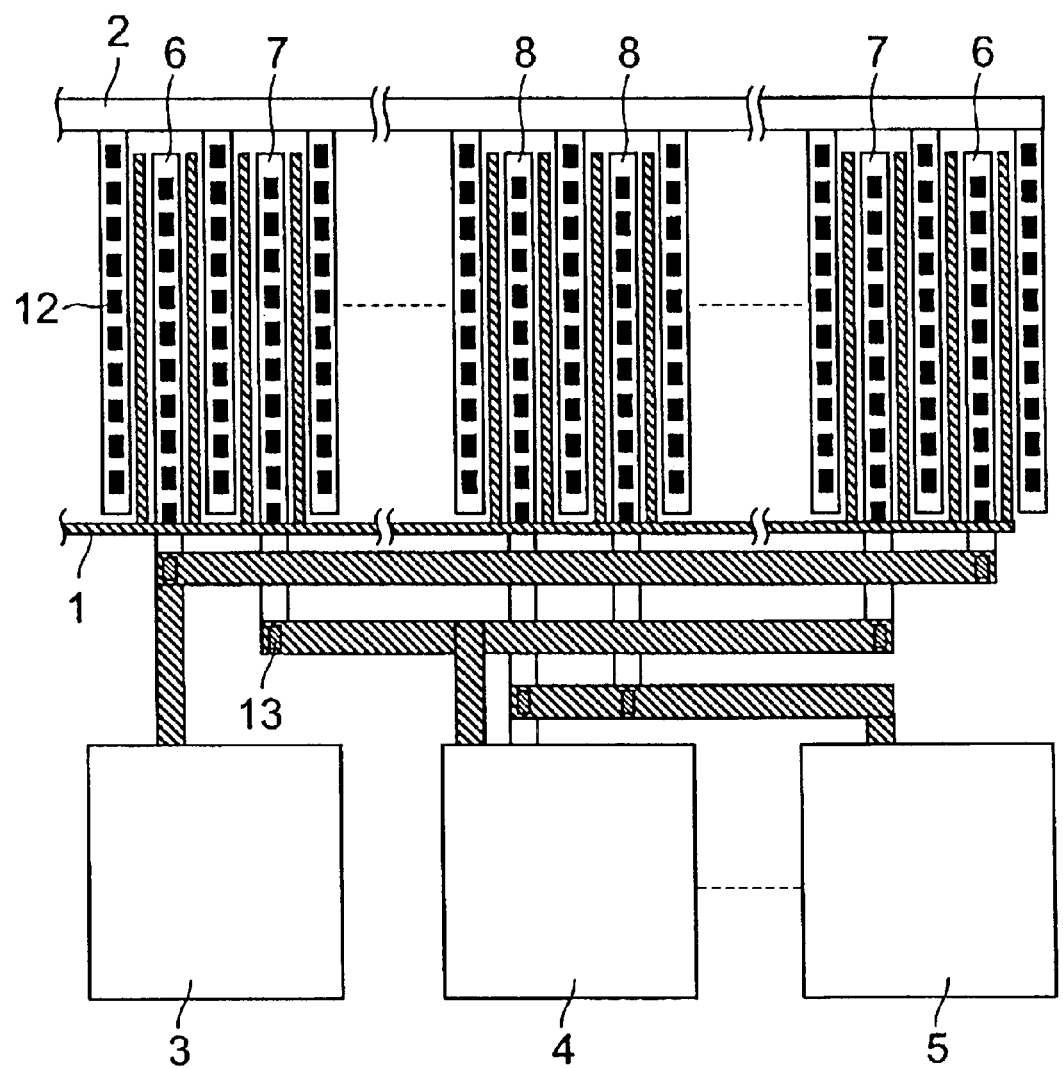
FIG. 1 is a structural diagram showing the arrangement of constant current elements of a constant current circuit in accordance with an embodiment mode.

FIG. 1 is a structural diagram showing the arrangement of constant current elements in a constant current circuit in accordance with this embodiment. A gate terminal 1 and a source terminal 2 in the constant current elements which are n-type MOS transistors or p-type MOS transistors are commonly employed in all of the plural channels. Each of the individual branched drain terminals are commonly connected in the order of a first drain terminal 6, a second drain terminal 7 and an n-th drain terminal 8 from each of the left end and right end of the gate terminal 1 and the source terminal 2 toward the center. In this way, the N-th branched drain terminals 8 which correspond to the N-th channel are adjacent to each other in the center. Then the drain terminals are structured so as to be connected to a first output terminal channel 3, a second output terminal channel 4 and an N-th output terminal channel 5 which are output terminals of the respective channels.

Figure 2:
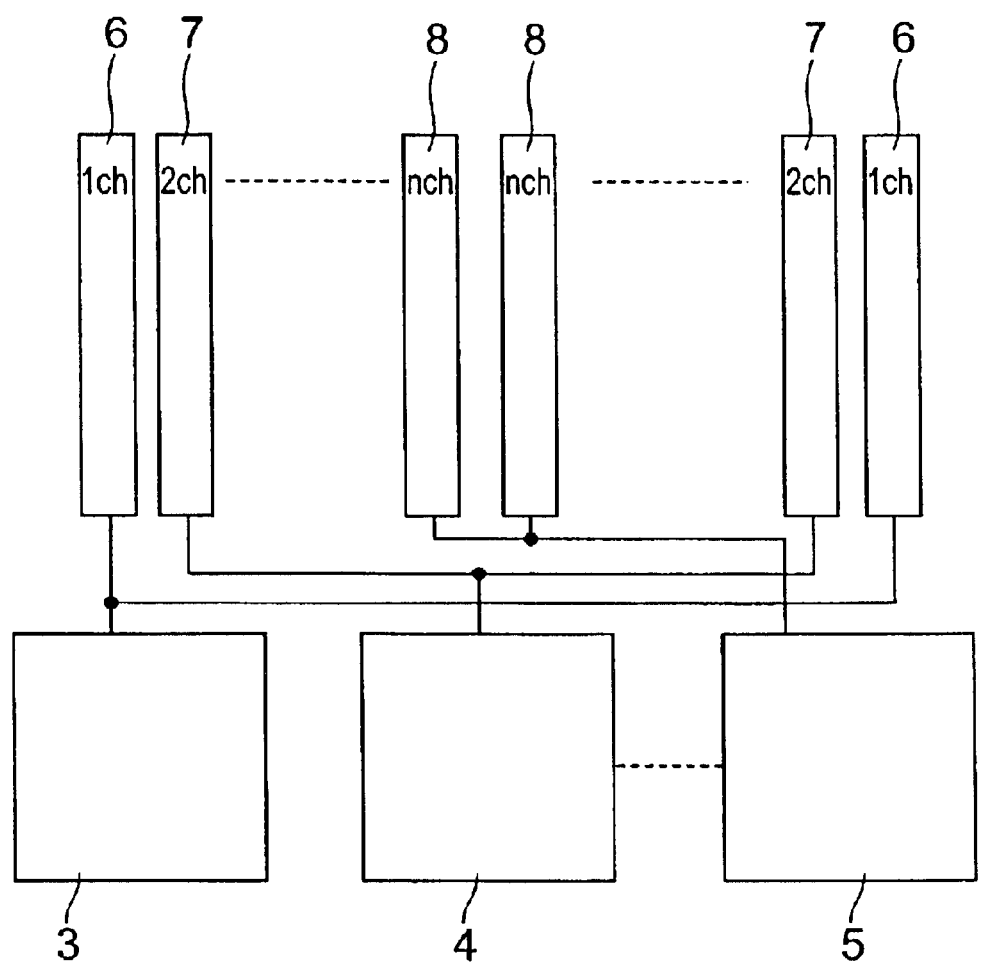
FIG. 2 is a diagram showing the schematic structure of the constant current circuit in accordance with the embodiment mode.
Figure 3:
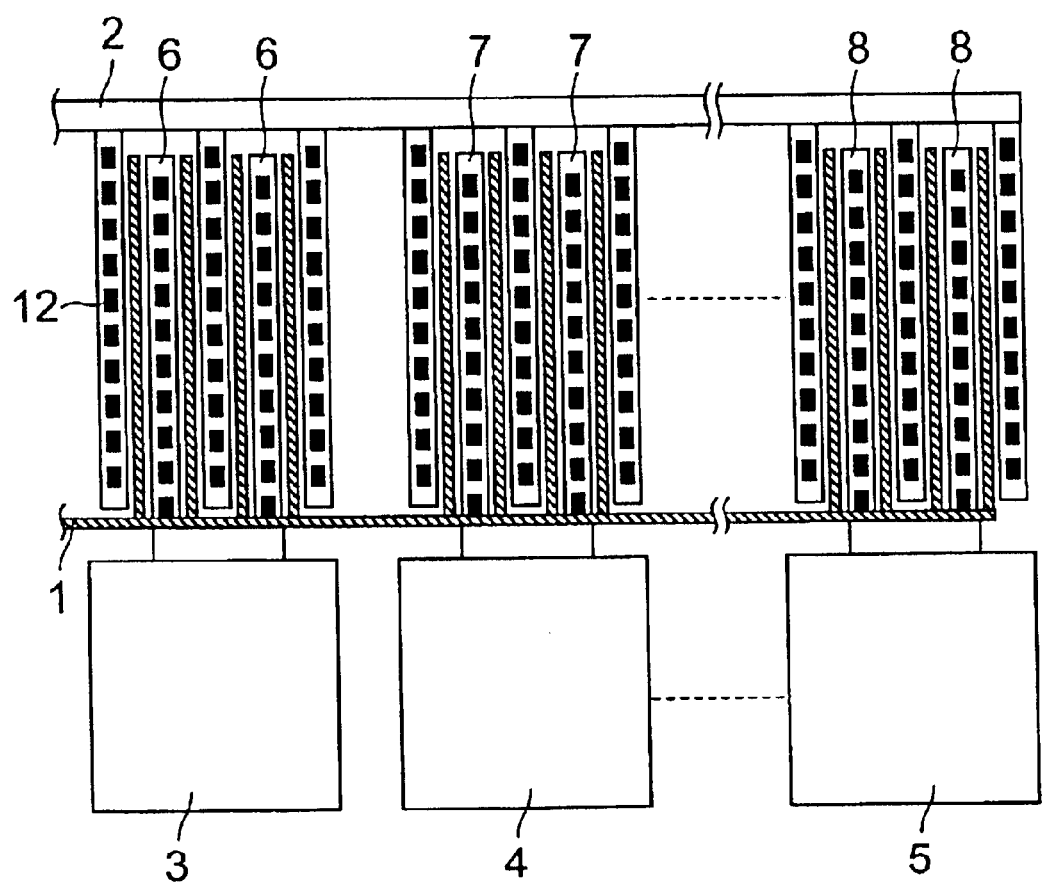
FIG. 3 is a structural diagram showing the arrangement of a conventional constant current circuit.
Figure 4:
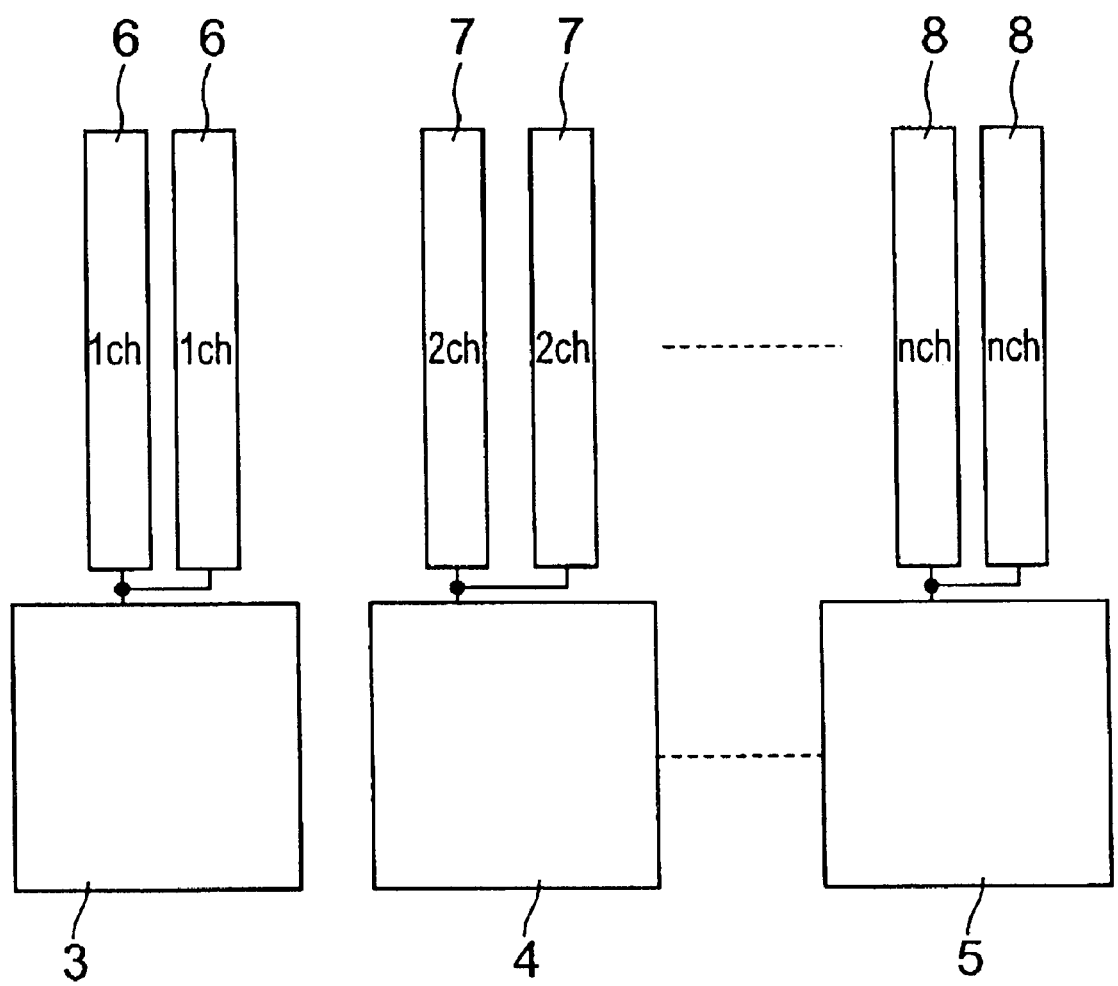
FIG. 4 is a diagram showing the schematic structure of the conventional constant current circuit.

The simplification of this arrangement diagram corresponds to a structural diagram shown in FIG. 2. FIG. 2 shows only the connection of the drain terminals in which the source terminal 1 and the gate terminal 2 are omitted from the structural diagram shown in FIG. 1.

Even in the case where a variation in the values of a current and a voltage which are supplied ot the respective constant current elements occurs due to the wiring resistance of the commonly used source terminal 1 and the gate terminal 2, in the respective constant current elements, an influence of the variation in the current value and the voltage value of the source terminal 1 and the gate terminal 2 can be unified. In this embodiment, the current values and the voltage values are ideally unified to values of the current and the voltage which are supplied from the source terminal 1 and the gate terminal 2 to the n-th drain terminal 8. In this way, a variation in the current value among the respective channels can be suppressed. Also, it is possible to reduce a variation due to the influence of temperature on the structural elements due to a difference of the arrangement of the respective constant current elements. That is, a variation in the current value among the channels due to the temperature change can also be suppressed.

Figure 7:
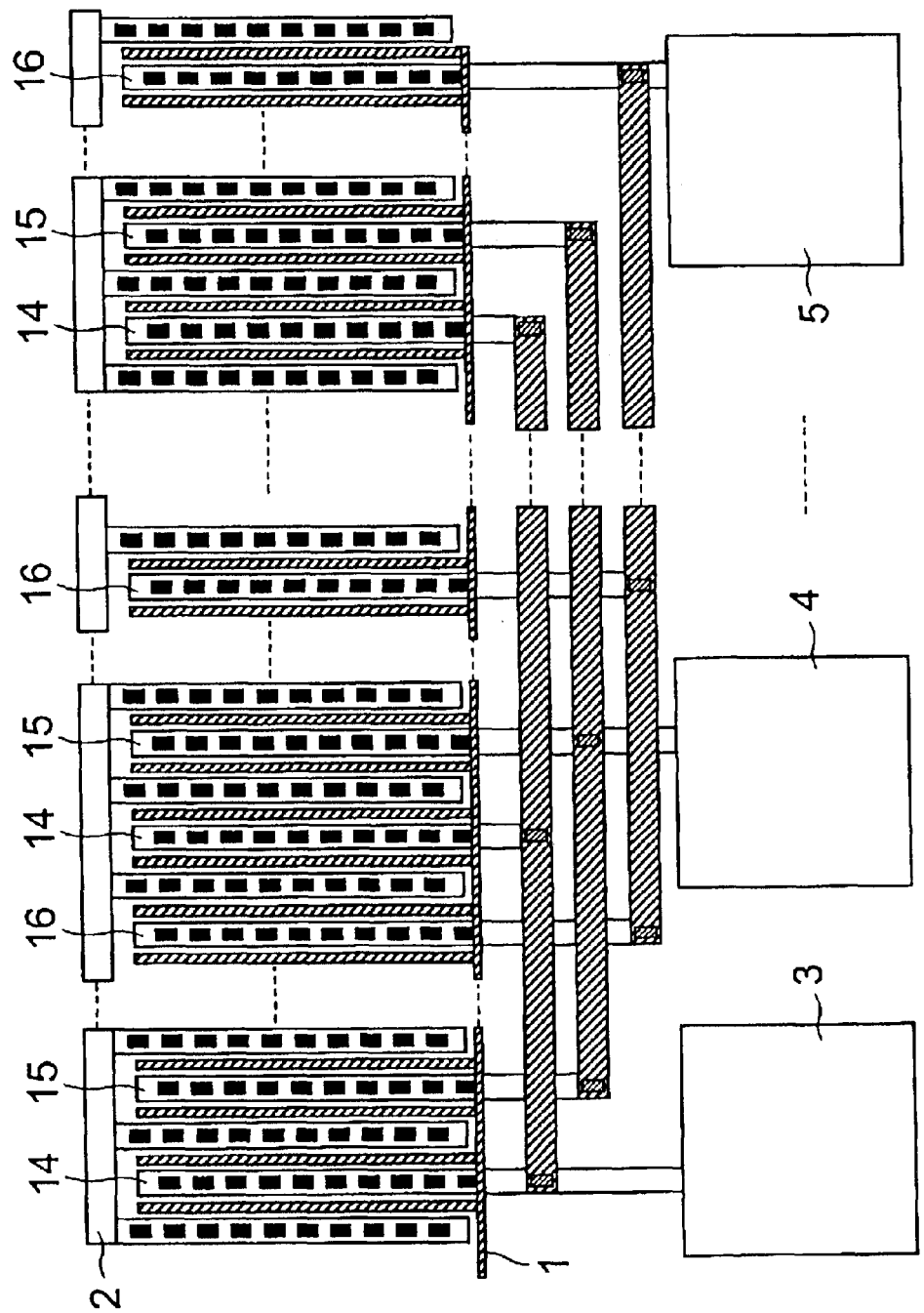
FIG. 7 is a structural diagram showing the arrangement of constant current elements of a constant current circuit in accordance with another embodiment mode.

FIG. 7 is a structural diagram showing the arrangement of the constant current elements in a constant current circuit in accordance with another embodiment mode. The gate terminal 1 and the source terminal 2 in the constant current elements which are the n-type MOS transistors or the p-type MOS transistors are made common in all of the channels. The respective drain terminals which are branched in M pieces are arranged in the order of a first drain terminal 14, a second drain terminal 15 and an n-th drain terminal from the left end of the gate terminal 1 and the source terminal 2 toward the right end thereof. In this way, the respective drain terminals are arranged in turn up to an M-th branched drain terminal in such a manner that the first branched N-th drain terminal 16 and the second branched first drain terminal 14 which correspond to the N-th channel, are adjacent to each other. Then, those drain terminals are structured so as to be connected to the first output terminal channel 3, the second output terminal channel 4 and the N-th output terminal channel 5 which are the output terminals of the respective channels.

Figure 8:
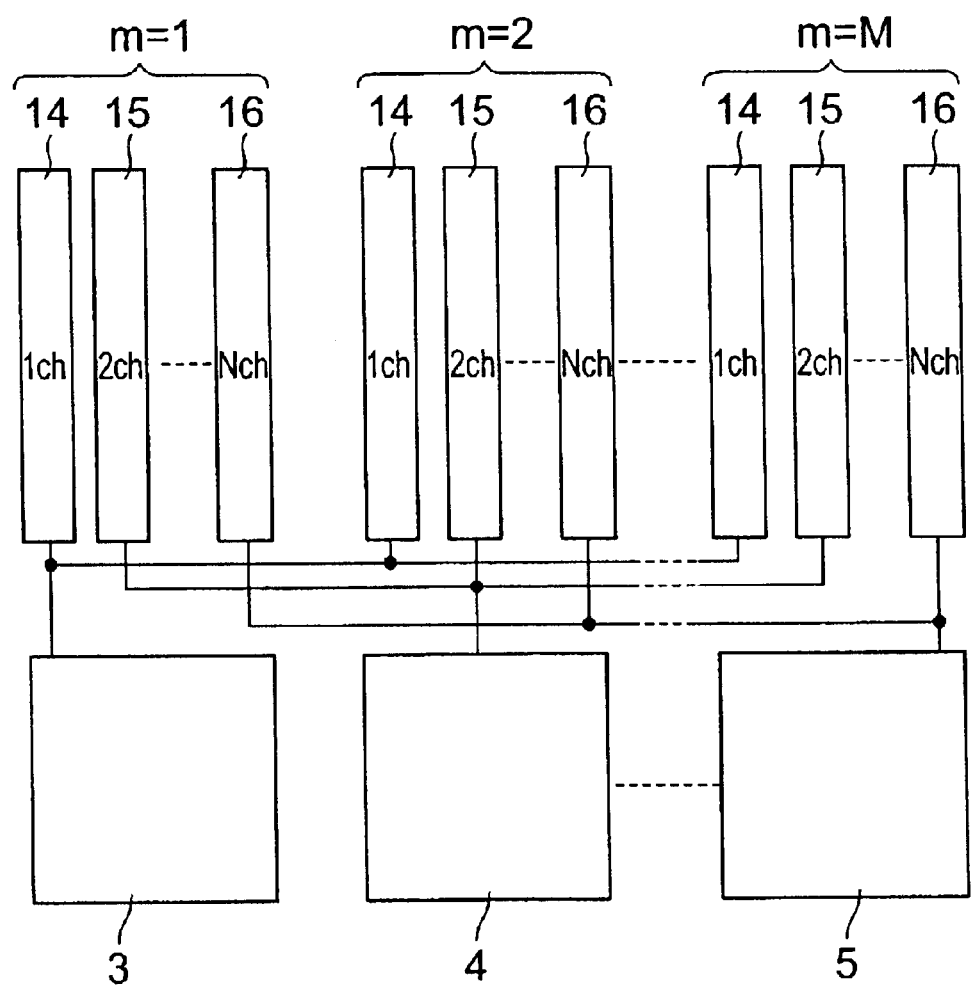
FIG. 8 is a diagram showing the schematic structure of the constant current circuit in accordance with the embodiment mode.

The simplification of this arrangement diagram corresponds to a structural diagram shown in FIG. 8. FIG. 8 shows only the connection of the drain terminals in which the source terminal 1 and the gate terminal 2 are omitted from the structural diagram shown in FIG. 7.

Even in the case where a variation in the values of a current and a voltage which are supplied to the respective constant current elements occurs due to the wiring resistance of the commonly used source terminal 1 and gate terminal 2; in the respective constant current elements, an influence of the variation in the current value and the voltage value of the source terminal 1 and the gate terminal 2 can be unified. In this embodiment, the current values and the voltage values are ideally unified to values of the current and the voltage which are supplied form the source terminal 1 and the gate terminal 2 to the N-th drain terminal 8. In this way, a variation in the current value among the respective channels can be suppressed. Also, it is possible to reduce a variation in an influence of a temperature which is caused by other structural elements due to a difference of the arrangement of the respective constant current elements. That is, a variation in the current value among the channels due to the temperature change can also be suppressed.

Figure 5:
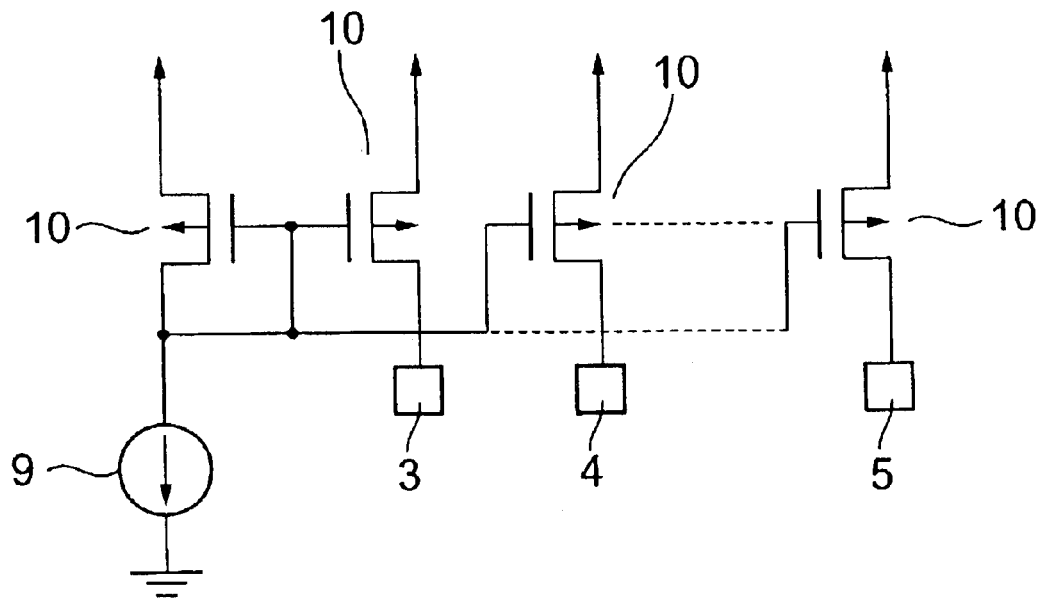
FIG. 5 is a circuit structural diagram showing the constant current circuit using the constant current elements in accordance with the embodiment mode of the present invention.

Embodiments of the constant current circuit using the constant current elements structured as described above are shown in FIGS. 5 and 6. FIG. 5 is a diagram showing the embodiment of the constant current circuit using a p-type MOS transistor as a constant current element, and FIG. 6 a diagram showing the embodiment of the constant current circuit using an n-type MOS transistor as a constant current element.

Figure 6:
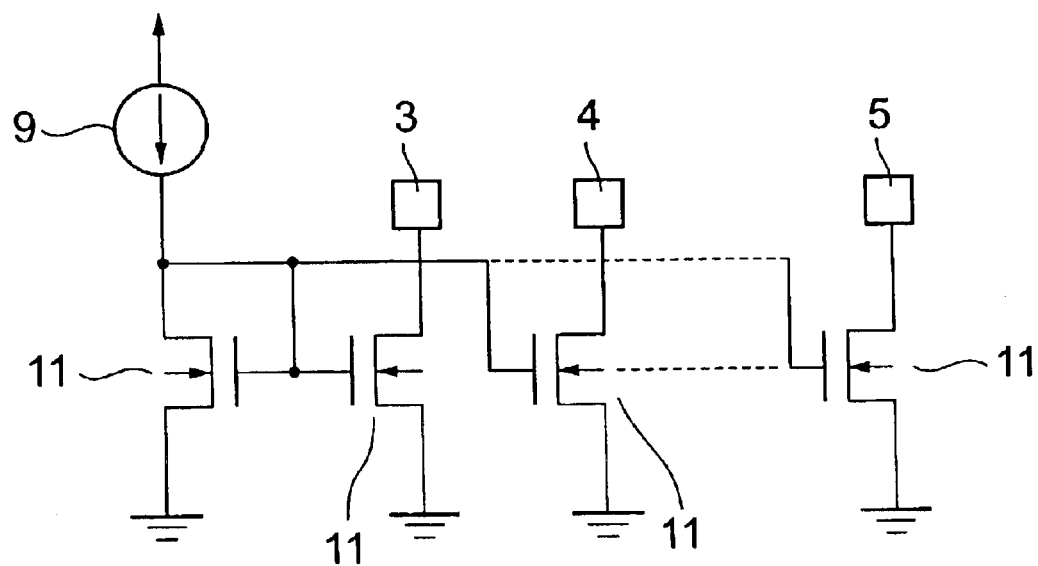
FIG. 6 is a circuit structural diagram showing a constant current circuit using the constant current elements in accordance with the embodiment mode.

Referring to FIGS. 5 and 6, reference numeral 9 denotes a constant current source, reference numeral 10 denotes a constant current element p-type MOS transistor, and reference numeral 11 denotes a constant current element n-type MOS transistor. In addition, reference numeral 12 denotes a contact hole for conducting wiring, and reference numeral 13 denotes a bear hole for conducting wiring. As shown in the figure, the constant current elements of the constant current circuit are structured, thereby being capable of providing a semiconductor device having a constant current circuit with high precision.

As described above, according to the present invention, it is possible to unify the current value and the voltage value due to a distribution of both the wiring resistance which is added to the source terminal and the wiring resistance which is added to the gate terminal by the element unit of the p-type or n-type MOS transistor which is each of the constant current element. Further, it is possible to unify an influence of the current value due to a change in temperature. Accordingly, it is possible to control the current values of the respective channels more accurately, and it is possible to supply a constant current having matching among the respective channels with high precision.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiment modes and embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor integrated circuit comprising: a plurality of constant current elements arranged in a row symmetrically on opposite sides of a central one of the constant current elements, each constant current element having a branched source, a branched gate and a branched drain; a common gate terminal electrically connected to the branched gates of all of the constant current elements; a common source terminal electrically connected to the branched sources of all of the constant current elements; and branched drain terminals electrically connected to the branched drains of the plurality of the constant current elements, the branched drains of the constant current elements located symmetrically at opposite sides of the central constant current element being electrically connected to a common one of the branched drain terminals.

2. A semiconductor integrated circuit according to claim 1; wherein the plurality of constant current elements comprises N constant current elements, wherein N is an integer of 2 or more, and the branched drains of each pair of constant current elements located at a position n (where n is an integer between 2 and N) away from opposite ends of the row of the constant current elements are commonly connected to a single branched drain terminal.

3. A semiconductor integrated circuit according to claim 1; wherein the common source terminal is disposed at one end of each constant current element, and current is supplied to the common source terminal from a current source disposed at one end of the row of constant current elements.

4. A semiconductor integrated circuit according to claim 3; wherein the constant current elements comprise MOS transistors.

5. A semiconductor integrated circuit comprising: a plurality of constant current elements arranged in a row symmetrically on opposite sides of a central one of the constant current elements, each constant current element having a branched source, a branched gate and a branched drain; a common gate terminal electrically connected to the branched gates of all of the constant current elements; a common source terminal electrically connected to the branched sources of all of the constant current elements; and branched drain terminals connected electrically to the branched drains of the constant current elements; wherein the circuit has M branched drain terminals, wherein M is an integer of 2 or more, and N×M constant current elements, wherein N is an integer of 2 or more, and the m-th branched drain terminal is electrically connected to the branched drains of the ((m−1)×N+n)-th constant current element from an end of the row of constant current elements, wherein m is an integer between 1 and M, and n is an integer from 1 to N×H.

6. A semiconductor integrated circuit according to claim 5; wherein the common source terminal is disposed at one end of each constant current element, and current is supplied to the common source terminal from a current source disposed at one end of the row of constant current elements.

7. A semiconductor integrated circuit comprising: a plurality of constant current elements arranged in a row symmetrically on opposite sides of a central one of the constant current elements, each constant current element having a branched source, a branched gate and a branched drain; a common gate terminal electrically connected to the branched gates of all of the constant current elements; a common source terminal electrically connected to the branched sources of all of the constant current elements; and branched drain terminals each electrically connected to one or more of the branched drains of two or more different constant current elements, each branched drain terminal being connected to the branched drains of two constant current elements that are symmetrically disposed with respect to each other on opposite sides of the central constant current element for unifying current flow through each branched drain terminal.

8. A semiconductor integrated circuit according to claim 7; wherein the constant current elements comprise MOS transistors.

9. A semiconductor integrated circuit according to claim 7; wherein the common source terminal is disposed at one end of each constant current element, and current is supplied to the common source terminal from a current source disposed at one end of the row of constant current elements.

* * * * *